US009871522B2

(12) United States Patent
Hu et al.

(10) Patent No.: US 9,871,522 B2
(45) Date of Patent: Jan. 16, 2018

(54) VOLTAGE LEVEL SHIFTING CIRCUITS FOR SIGNAL LEVELS AND/OR POWER SUPPLY VOLTAGE LEVELS USING CONSTANT VOLTAGE CIRCUIT ELEMENTS, LIGHTING APPARATUSES AND METHODS OF OPERATING THE SAME

(71) Applicant: Cree, Inc., Durham, NC (US)

(72) Inventors: Qingcong Hu, Morrisville, NC (US); Daniel Pope, Morrisville, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 14/701,025

(22) Filed: Apr. 30, 2015

(65) Prior Publication Data
US 2016/0322972 A1 Nov. 3, 2016

(51) Int. Cl.
*H05B 33/08* (2006.01)
*H03K 19/0185* (2006.01)

(52) U.S. Cl.
CPC . *H03K 19/018521* (2013.01); *H05B 33/0815* (2013.01)

(58) Field of Classification Search
None
See application file for complete search history.

(56) References Cited

U.S. PATENT DOCUMENTS

| 2007/0285381 A1* | 12/2007 | Gong | G09G 3/3406 345/102 |
| 2008/0030229 A1* | 2/2008 | Walker | H03K 3/356104 326/68 |
| 2009/0289685 A1* | 11/2009 | Quinn | H03F 1/0211 327/333 |
| 2013/0069535 A1 | 3/2013 | Athalye | |
| 2013/0069536 A1 | 3/2013 | Ni | |
| 2013/0069547 A1* | 3/2013 | van de Ven | H05B 33/0809 315/188 |
| 2014/0346874 A1 | 11/2014 | Fang et al. | |

* cited by examiner

*Primary Examiner* — Jany Richardson
(74) *Attorney, Agent, or Firm* — Myers Bigel, P.A.

(57) ABSTRACT

A level shifting circuit can include a level shifting circuit input node that can be coupled to an input signal, where the input signal can be configured to switch between discrete voltage levels in an input voltage domain. A level shifting circuit output node of the level shifting circuit can be configured to provide shifted voltage levels that are shifted relative to the input signal responsive to switching of the input signal. A constant voltage element can have a first terminal that can be coupled to the level shifting circuit input node and can have a second terminal that can be coupled to the level shifting circuit output node. The constant voltage element can be configured to provide a constant voltage level shift to the input signal to provide the shifted voltage levels responsive to switching of the input signal between the discrete voltage levels in the first voltage domain.

12 Claims, 5 Drawing Sheets

VOLTAGE LEVEL SHIFTING CIRCUITS FOR SIGNAL LEVELS AND/OR POWER SUPPLY VOLTAGE LEVELS USING CONSTANT VOLTAGE CIRCUIT ELEMENTS, LIGHTING APPARATUSES AND METHODS OF OPERATING THE SAME

FIELD OF THE INVENTION

The invention relates to the field of electronics in general, and more particularly, to voltage level shifting.

BACKGROUND

Voltage level shifting is sometimes used in electrical systems that include circuits that utilize different voltage levels. For example, in an electrical system that is controlled by a processor (such as a microcontroller), the processor may generate signals having voltage levels that vary between 0 volts and 3.3 volts, whereas circuitry external to the processor may have voltage levels that vary from 0-12 volts.

FIG. 1 is an example of a conventional technique used to shift the voltage level of a signal. Referring to FIG. 1, an input signal can be applied at $V_{in}$ to a voltage controlled current source (VCCS) which controls the flow of current $I_{itm}$ through a resistor R. The current $I_{itm}$ through the resistor R develops an output voltage $V_{out}$ that is shifted relative to the input signal $V_{in}$. Accordingly, the arrangement shown in FIG. 1 employs an input voltage that generates an intermediate current signal ($I_{itm}$) which in turn develops an output voltage across the resistor R.

FIG. 2 is a circuit diagram that illustrates a particular level shifting circuit of the type illustrated in FIG. 1. According to FIG. 2, the input signal is provided at $V_{in}$ at the base of a transistor Q (or gate of a MOSFET Q). The operation of the transistor Q can generate a current through the resistor R to provide a voltage $V_{itm}$ to the base of each of the transistors $Q_n$ and $Q_p$ to provide a shifted voltage output $V_{gd}$. In operation, when the transistor Q is toggled on/off by the switching of $V_{in}$, the intermediate voltage $V_{itm}$ toggles between a power supply voltage $V_{cc}$ and a reference voltage $V_{ref}$ (which can be, for example, ground).

SUMMARY

Embodiments according to the invention can provide voltage level shifting circuits for signals and/or power supply voltage levels using constant voltage circuit elements, lighting apparatuses, and method of operating the same.

Pursuant to these embodiments, a level shifting circuit can include a level shifting circuit input node that can be coupled to an input signal, where the input signal can be configured to switch between discrete voltage levels in an input voltage domain. A level shifting circuit output node of the level shifting circuit can be configured to provide shifted voltage levels that are shifted relative to the input signal responsive to switching of the input signal. A constant voltage element can have a first terminal that can be coupled to the level shifting circuit input node and can have a second terminal that can be coupled to the level shifting circuit output node. The constant voltage element can be configured to provide a constant voltage level shift to the input signal to provide the shifted voltage levels responsive to switching of the input signal between the discrete voltage levels in the first voltage domain.

DETAILED DESCRIPTION OF EMBODIMENTS ACCORDING TO THE INVENTION

Figure 1:
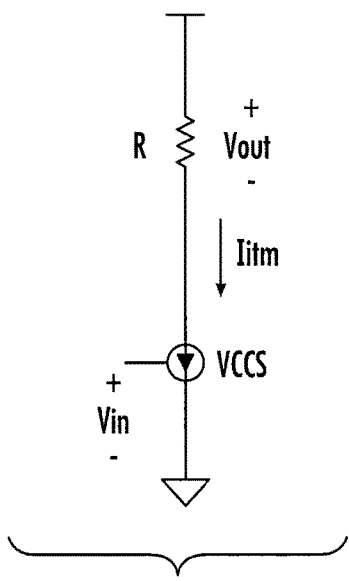
FIG. 1 is a conventional voltage level shifting circuit using an intermediate current to provide a shifted voltage level.
Figure 2:
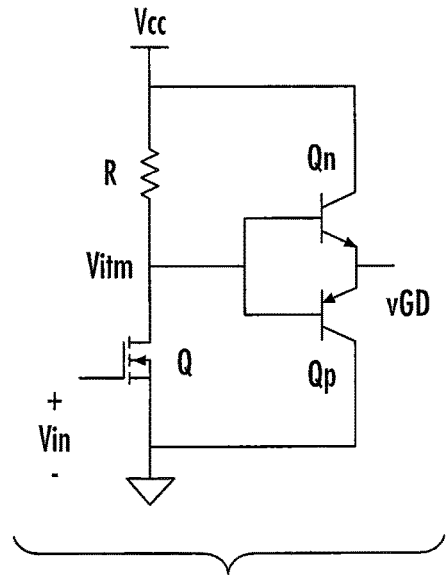
FIG. 2 is a conventional voltage level shifting circuit using an intermediate current to provide a shifted voltage level.

Embodiments of the present inventive subject matter are described hereinafter with reference to the accompanying drawings, in which embodiments of the present inventive subject matter are shown. This present inventive subject matter may, however, be embodied in many different forms and should not be construed as limited to the embodiments set forth herein. Rather, these embodiments are provided so that this disclosure will be thorough and complete, and will fully convey the scope of the present inventive subject matter to those skilled in the art. Like numbers refer to like elements throughout.

The expression "lighting apparatus", as used herein, is not limited, except that it indicates that the device is capable of emitting light. That is, a lighting apparatus can be a device which illuminates an area or volume, e.g., a structure, a swimming pool or spa, a room, a warehouse, an indicator, a road, a parking lot, a vehicle, signage, e.g., road signs, a billboard, a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, or a device or array of devices that illuminate an enclosure, or a device that is used for edge or back-lighting (e.g., back light poster, signage, LCD displays), bulb replacements (e.g., for replacing AC incandescent lights, low voltage lights, fluorescent lights, etc.), lights used for outdoor lighting, lights used for security lighting, lights used for exterior residential lighting (wall mounts, post/column mounts), ceiling fixtures/wall sconces, under cabinet lighting, lamps (floor and/or table and/or desk), landscape lighting, track lighting, task lighting, specialty lighting, ceiling fan lighting, archival/art display lighting, high vibration/impact lighting, work lights, etc., mirrors/vanity lighting, or any other light emitting device.

As appreciated by the present inventors, in some embodiments according to the invention, a voltage level shifting circuit may be realized utilizing a constant voltage element (such as a capacitor) coupled between an input to the voltage level shifting circuit and an output of the voltage level shifting circuit. In operation, the voltage level shifting circuit can shift the level of the input signal to a corresponding voltage level at the output of the voltage level shifting circuit. For example, when the input signal is at a low voltage, the voltage level shifting circuit can provide a constant voltage level shift to the input signal to provide a corresponding shifted voltage level for the output of the voltage level shifting circuit. When, however, the input signal switches to a high voltage level, the voltage level shifting circuit provides the same constant voltage level shift to provide a corresponding shifted voltage level for the output. Therefore, as the input signal switches between the high and low voltage levels, the voltage level shifting circuit can provide the same constant voltage level shift to the level of the input signal to provide shifted voltage levels at the output of the voltage level shifting circuit.

As used herein, the term "voltage domain" refers to a range of voltage levels that can be processed by circuits in that particular domain. Accordingly, signals that are appropriate for a particular "voltage domain" are processed using circuits that operate using the range of voltage levels appropriate for that particular "voltage domain."

Still further, the term "input voltage domain" can refer to a voltage domain that is associated with an input of the voltage level shifting circuit, whereas the term "output voltage domain" refers to a voltage domain that is associated with an output of the voltage level shifting circuit. For example, in some embodiments according to the invention, an input voltage domain can be a range of voltages from about 0 volts DC to about 3.3 volts DC. In this example, circuits in the input voltage domain can process signals having voltage levels within the input voltage domain that represent, for example, high and low logic levels generated by the circuits in the input voltage domain.

For example, in some embodiments according to the invention, the input voltage domain described above can be embodied in a microcontroller such that a low logic level corresponds to about 0 volts whereas a high logic level can corresponds to about 3.3 volts. Therefore, when a low logic level is to be transmitted in the input voltage domain, the corresponding device may generate a voltage level of about 0 volts, whereas when a high logic level is to be transmitted in the input voltage domain, a voltage level of about 3.3 volts can be transmitted. It will be understood that these voltage levels are exemplary and other voltage levels may be used. Furthermore, the voltage levels described can correspond to voltage thresholds (minimum/maximum) that are specified for the voltage domain. For example, a 3.3 Volt voltage level may correspond to the minimum value that is recognized as a high logic level whereas 0 Volts may correspond to a maximum value that is recognized as a low logic level. Other correspondence, such as nominal logic levels, may be used.

In contrast, an output voltage domain can be represented by a different range of voltage levels relative to the input voltage domain. It will be further understood that the output voltage domain can be either scaled up or scaled down relative to the input voltage domain. In other words, the range of voltages included in the output voltage domain may be greater than those in the input voltage domain or less than those in the input voltage domain. Still further, it will be understood that the output voltage domain can include a range of voltage levels that are amplified relative to those voltage levels in the input voltage domain which correspond to the output voltage domain. For example, in some embodiments according to the invention, the output voltage domain may support voltage levels from about 0 volts (corresponding to a low logic level) to 12 volts DC (corresponding to a high logic level) in the output voltage domain. Accordingly, the voltage levels included in the input signal (in the input voltage domain) can be amplified (by use of the voltage level shifting circuit) to corresponding voltage levels within the output voltage domain. For example, a low logic level of 0 volts in the input voltage domain can be amplified to 0 volts in the output voltage domain, whereas a voltage level of about 3.3 volts in the input voltage domain can be amplified to a voltage level of about 12 volts DC in the output voltage domain.

The term "constant," when used to refer to a voltage level shift, can include small variations in the voltage level which can be attributed to, for example, variation in circuit elements used to implement the voltage level shifting circuit in some embodiments according to the invention. Accordingly, the term "constant" when used to refer to a voltage level shift will be understood to include values which are substantially or about equal to one another.

As used herein, the term "discrete voltage levels" refers to voltage levels within a particular voltage domain which correspond to logic levels in that domain. For example, in some embodiments according to the invention, the discrete voltage levels included in the input voltage domain can refer to voltage levels that correspond to a logical low level and to voltage levels that correspond to a logical high level.

Figure 3:
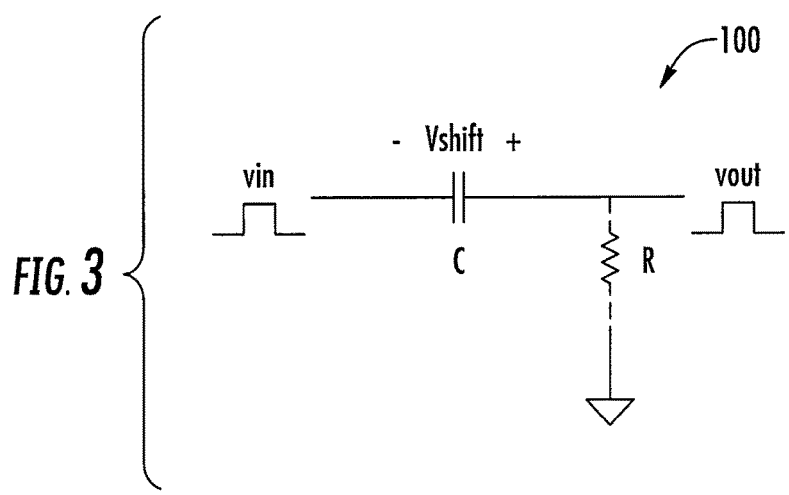
FIG. 3 is a schematic illustration of a voltage level shifting circuit in some embodiments according to the invention.

FIG. 3 is a schematic illustration of a voltage level shifting circuit in some embodiments according to the invention. According to FIG. 3, the voltage level shifting circuit 100 includes a capacitor C coupled in series with a load R representing the impedance presented to an output of the voltage level shifting circuit 100. As further illustrated by FIG. 3, an input node of the voltage level shifting circuit 100 is coupled to an input signal $V_{in}$ configured to operate in an input voltage domain. An output node of the voltage level shifting circuit 100 generates a signal $V_{out}$ which corresponds to the input signal $V_{in}$ but is shifted relative to the input signal $V_{in}$ by a constant voltage level $V_{shift}$ provided across the capacitor C.

For example, in operation, the capacitor C provides a constant voltage shift $V_{shift}$ to the input signal $V_{in}$ to provide the voltage levels for the signal $V_{out}$. Accordingly, the capacitor C shifts the low voltage level of the input signal $V_{in}$ by $V_{shift}$ to provide the low voltage level for the output signal $V_{out}$. The capacitor C also provides the constant voltage level shift $V_{shift}$ to the high voltage level of the input signal $V_{in}$ to provide the high voltage level of the output signal $V_{out}$. Accordingly, during switching of the input signal $V_{in}$, the capacitor C provides the constant voltage level shift $V_{shift}$ to the input signal to provide the voltage levels associated with the output signal $V_{out}$.

Figure 4:
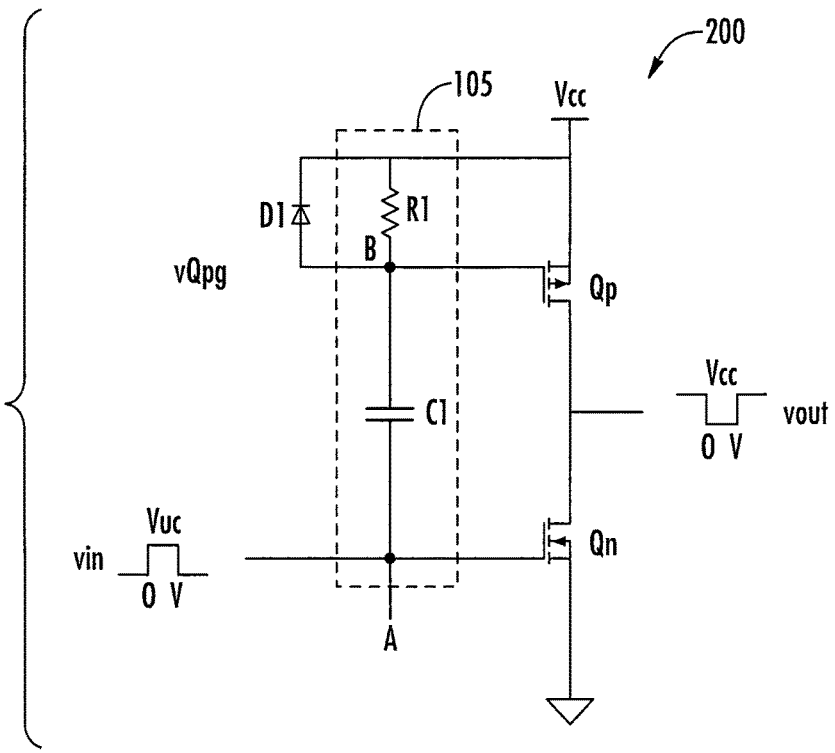
FIG. 4 is an inverting voltage level shifting circuit in some embodiments according to the invention.

FIG. 4 is a gate-drive circuit 200 including a voltage level shifting circuit 105 that includes a capacitor C1 coupled in series with a resistor R1 in some embodiments according to the invention. According to FIG. 4, the combination of the capacitor C1, the resistor R1 and the diode D1 provides a constant voltage element so that a constant voltage level shift $V_{shift}$ can be provided between an input node A of the voltage level shifting circuit 105 and an output node B of the voltage level shifting circuit 105 between resistor R1 and the capacitor C1 which is coupled to the base of a transistor $Q_p$. The diode D1 is configured to prevent the voltage at the base of transistor $Q_p$ from exceeding $V_{cc}$, which also defines $V_{shift}$ to be $V_{cc}$ less $V_{uc}$.

Figure 5:
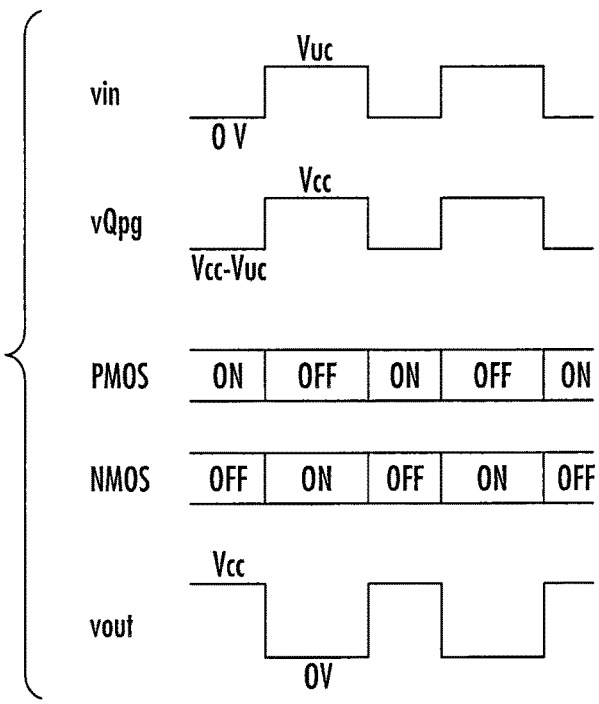
FIG. 5 is a timing diagram illustrating operations of the circuit shown in FIG. 4 in some embodiments according to the invention.

As illustrated in FIG. 5, in operation, the combination of the capacitor C1 and the resistor R1 provides a constant voltage level shift $V_{shift}$ from the input signal $V_{in}$ (operating in the input voltage domain) to provide shifted voltage levels at the base of the transistor $Q_p$. When the input signal $V_{in}$ varies between a voltage level of 0 volts (for a low logic level) and $V_{uc}$ (corresponding to a high logic level), the shifted voltage level $V_{shift}$ provided at the base of the transistor $Q_p$ (i.e., the output of the voltage level shifting circuit 105) varies from a low voltage level of about $V_{cc}$-$V_{uc}$ and $V_{cc}$ in response to the different states of the PMOS and NMOS transistors Qp and Qn, respectively. Accordingly, as the voltage at the base of the transistor $Q_p$ toggles between $V_{cc}$-$V_{uc}$ to $V_{cc}$, the transistor $Q_p$ is toggled on/off so that the output signal $V_{out}$ is inverted relative to the input signal and is amplified to vary between a voltage level of about $V_{cc}$ and 0 volts (i.e., amplified into the output voltage domain) responsive to the switching of the input signal $V_{in}$ (in the input voltage domain) Accordingly, when the input signal $V_{in}$ varies between 0 volts and about 3.3 volts, the output signal $V_{out}$ can vary between about 12 volts DC and 0 volts when the $V_{cc}$ power supply is equal to about 12 volts DC.

In order to keep the voltage across the capacitor C1 constant during switching of the input signal, the value of the capacitor C1 can be selected to be relatively large compared to a parasitic capacitance of the inputs of the PMOS and NMOS transistors Qp and Qn. For example, in some embodiments, the capacitance value of C1 can be about at least 5 times greater than the parasitic capacitance of the input of the load coupled to the level shifting circuit output node (such as the PMOS and NMOS transistors Qp and Qn). In some embodiments, the capacitance value of C1 can be about at least 10 times greater than the parasitic capacitance of the input of the load coupled to the level shifting circuit output node.

Furthermore, the value of the Resistor R1 can be selected in conjunction with the value of the Capacitor C1 to provide a sufficiently large RC time constant so that the voltage across the capacitor C1 remains constant despite the switching of the input signal $V_{in}$. In other words, a sufficiently large RC time constant can provide for the voltage across the capacitor C1 to remain constant during switching of the input signal $V_{in}$ so that the shift provided to the output signal $V_{out}$ remains constant during switching of the input signal $V_{in}$. In some embodiments according to the invention, the RC time constant is large relative to the switching frequency of the input signal $V_{in}$ (i.e., 1/switching period of the input signal $V_{in}$).

Figure 6:
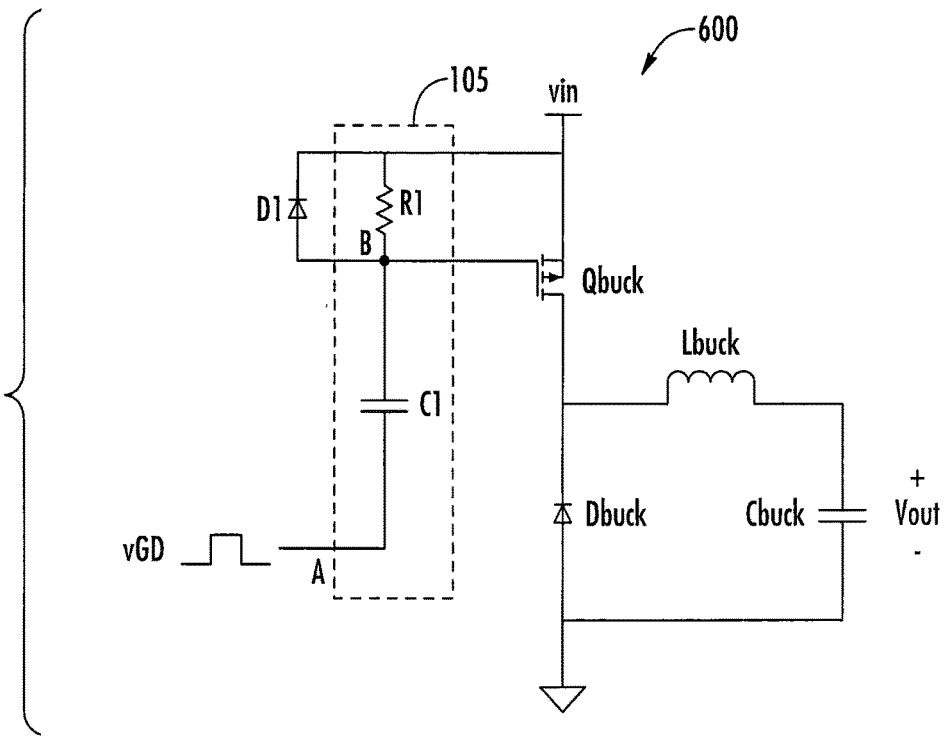
FIG. 6 is a schematic illustration of a voltage level shifting circuit configured to switch a buck converter to provide a voltage for powering a circuit in some embodiments according to the invention.

FIG. 6 is a schematic illustration of the voltage level shifting circuit 105 included in a buck converter circuit 600 in some embodiments according to the invention. According to FIG. 6, when the input signal $V_{gd}$ switches, a constant voltage level shift $V_{shift}$ is provided at the output node B of the voltage level shifting circuit 105 connected to the base of the transistor $Q_{buck}$. In response to the shifting of the input signal $V_{gd}$, the transistor $Q_{buck}$ controls the switching operation of the buck converter driving the output $V_{out}$ using the power supply voltage $V_{in}$ as the input.

Figure 7:
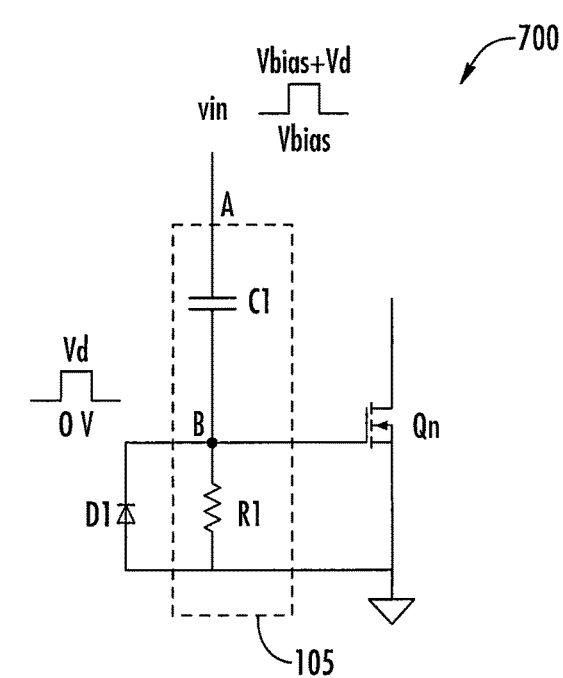
FIG. 7 is a schematic illustration of a voltage level shifting circuit configured to shift a high level input signal to a low level output signal in some embodiments according to the invention.

FIG. 7 is a schematic illustration of a voltage level shifting circuit 700 including a voltage level shifting circuit 105 to provide a constant voltage level shift so that a relatively high voltage level input signal ($V_{in}$) can be shifted to a relatively low voltage output signal $V_d$ in some embodiments according to the invention. According to FIG. 7, the input signal can be a relatively high level signal that is referenced to $V_{bias}$. In operation, the input signal $V_{in}$ may vary between a low voltage level of $V_{bias}$ and a high voltage level of $V_{bias}$+$V_d$. The voltage level shifting circuit 105 shifts the input signal $V_{in}$ by a constant voltage level $V_{shift}$ that is about equal to $V_{bias}$ so that the output of the voltage level shifting circuit 105 at the gate of the transistor $Q_n$ varies between 0 volts (at a low logic level) and $V_d$ (at a high logic level). Accordingly, the input voltage domain associated with $V_{in}$ can be greater than the output voltage domain associated with output of the voltage level shifting circuit 105 in some embodiments according to the invention.

Figure 8:
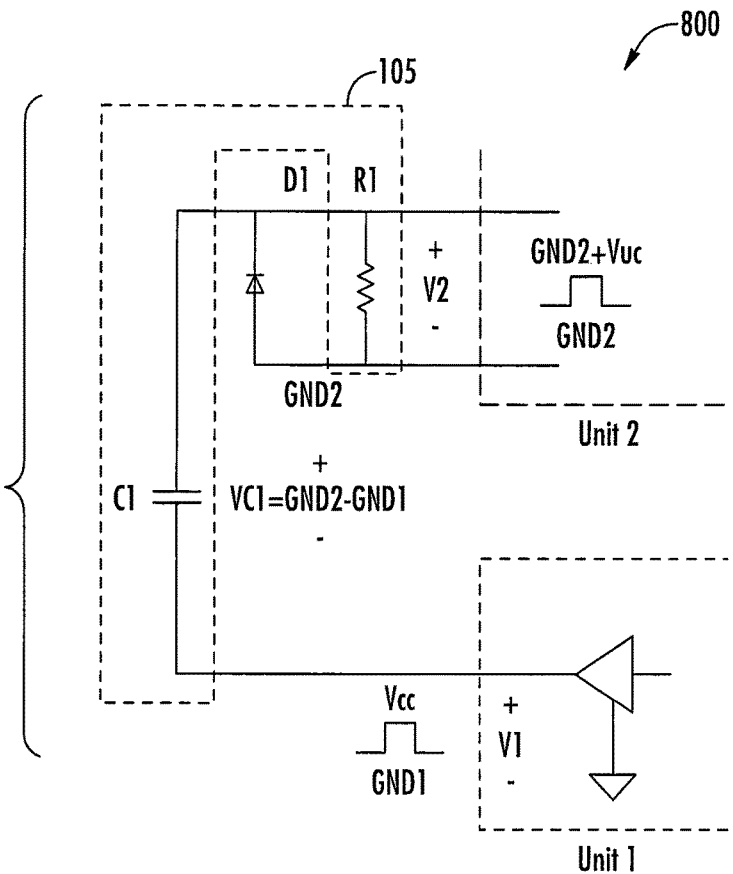
FIG. 8 is a schematic illustration of a system including a transmitter and a receiver each utilizing different respective voltage levels for data signals connected by a voltage level shifting circuit in some embodiments according to the invention.

FIG. 8 is a schematic illustration of a data transmission system 800 including a voltage level shifting circuit 105 used to shift the voltage levels associated with data signals transmitted between units 1 and 2 operating in respective different voltage domains in some embodiments according to the invention. According to FIG. 8, unit 1 operates in the input voltage domain having discrete voltage levels of GND1 as a low logic level, and $V_{cc}$ as a high logic level. In contrast, unit 2 operates in the output voltage domain including discrete voltage levels GND2 as a low logic level and GND2+$V_{uc}$ as a high logic level. Accordingly, the discrete voltage levels associated with the different voltage domains are different from one another.

In operation, the voltage level shifting circuit 105 provides a constant voltage level shift $V_{shift}$ to the signal provided by unit 1 as the input signal which varies between GND1 and $V_{cc}$ to provide a voltage level V2 at an output node of the voltage level shifting circuit 105. The voltage level shifting circuit 105 shifts the voltage V2 to provide discrete voltage levels GND2 as the low logic level and GND2+$V_{uc}$ as the high logic level in the output voltage domain in some embodiments according to the invention.

Figure 9:
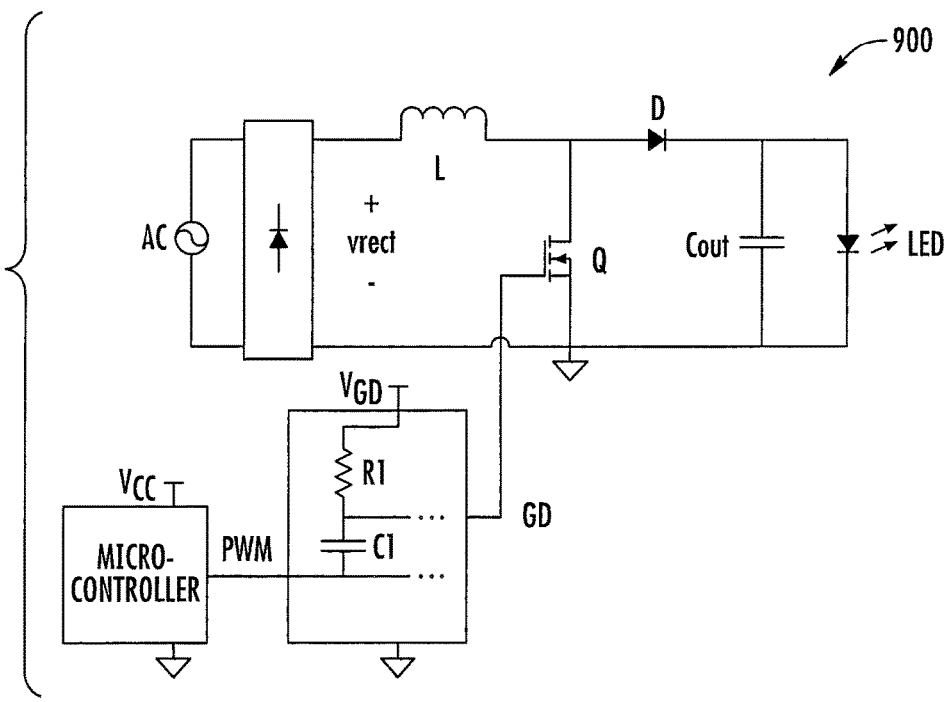
FIG. 9 is a schematic illustration of a lighting apparatus including a voltage level shifting circuit included in a gate-drive circuit used for switching control of a boost converter voltage supply to Light Emitting Diodes in some embodiments according to the invention

FIG. 9 is a schematic illustration of a lighting apparatus 900 in some embodiments according to the invention. According to FIG. 9, a rectifier circuit is configured for coupling to an AC voltage source to provide a rectified voltage $V_{rect}$ to a boost converter circuit including an inductor L, a diode D and an output capacitor $C_{out}$ as a power supply for an LED string. The lighting apparatus 900 in some embodiments according to the invention can be included in an LED lighting housing as shown, for example, in FIG. 10.

The boost converter circuit can provide a switched mode power supply that operates under the control of a pulse width modulated signal GD provided by a gate-drive circuit in some embodiments according to the invention. It will be understood that the pulse width modulated signal GD from the gate-drive circuit operates in the output voltage domain. As further shown in FIG. 9, a microcontroller provides a pulse width modulated input signal operating in an input voltage domain to the gate-drive circuit. It will be understood that the pulse width modulated signal provided as the input to the gate-drive circuit and the pulse width modulated output signal GD provided to the gate of the transistor Q in the boost converter can be in-phase with one another in some embodiments according to the invention. It will be understood that the gate-drive circuit can include any of the embodiments described herein to provide a constant voltage level shift relative to the pulse width modulated input signal to enable operation of the transistor Q in the boost converter operating in the output voltage domain.

It will be understood that although FIG. 9 schematically illustrates a single LED string, any configuration of LEDs can be used. For example, a single string of LEDs may be used. In some embodiments according to the invention, the LED segments can include more than one LED in series. In some embodiments according to the invention, the LED segments can include a parallel arrangement of LEDs, such as to LEDs in parallel in the segment. In still other embodiments according to the invention, a combination of additional LEDs in series as well as additional LEDs in parallel with one another in the segments can also be used. It will also be understood that term "single string" includes arrangements of LEDs where, for example, the current used for dimming the light emitted by the lighting apparatus is provided to the same input of all the LEDs arranged in the string. Other arrangements may also be used.

It will also be understood that the LEDs can have the same spectral characteristics (e.g. color) or can have spectral characteristics that are different. For example, the LEDs in a parallel/series combination can have any combination of spectral characteristics. The LEDs in the string(s) may be configured in a number of different ways and may have various compensation circuits associated therewith, as discussed, for example, in commonly assigned co-pending U.S. Patent Application Publication No. 2013/0069535 and U.S. Patent Application Publication No. 2013/0069536.

Figure 10A:
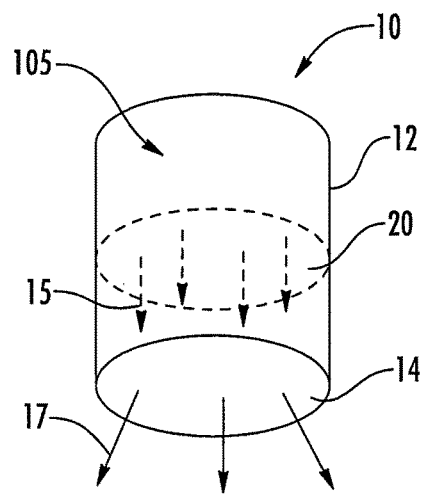
FIGS. 10A and 10B are schematic illustrations of the lighting apparatus of FIG. 9 included in an LED housing in some embodiments according to the invention.
Figure 10B:
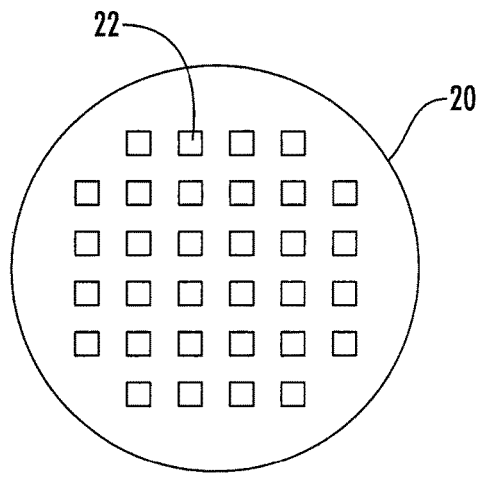

Referring to FIGS. 10A and 10B, the lighting apparatus 900 (including a voltage shifting circuit) can be embodied as the lighting apparatus 10 in some embodiments according to the present invention. The lighting apparatus 10 shown in FIGS. 10A and 10B may sometimes be referred to as a "recessed downlight" lighting fixture that may be suitable for use in general illumination applications as a down light or spot light. However, it will be appreciated that a lighting apparatus 10 according to some embodiments may have a different form factor. For example, a lighting apparatus according to some embodiments can have the shape of a conventional light bulb, a pan or tray light, an automotive headlamp, or any other suitable form.

The lighting apparatus 10 can generally include a can shaped outer housing 12 in which a lighting panel 20 is arranged. In FIGS. 10A and 10B, the lighting panel 20 has a generally circular shape so as to fit within an interior of the housing 12. Light is generated by solid state lighting devices (LEDs) 22, which are mounted on the lighting panel 20, and which are arranged to emit light 15 towards and an optional diffusing lens 14 mounted connected to the housing 12. Diffused light 17 is emitted through the lens 14. In some embodiments, the lens 14 may not diffuse the emitted light 15, but may redirect and/or focus the emitted light 15 in a desired near-field or far-field pattern.

Figure 11:
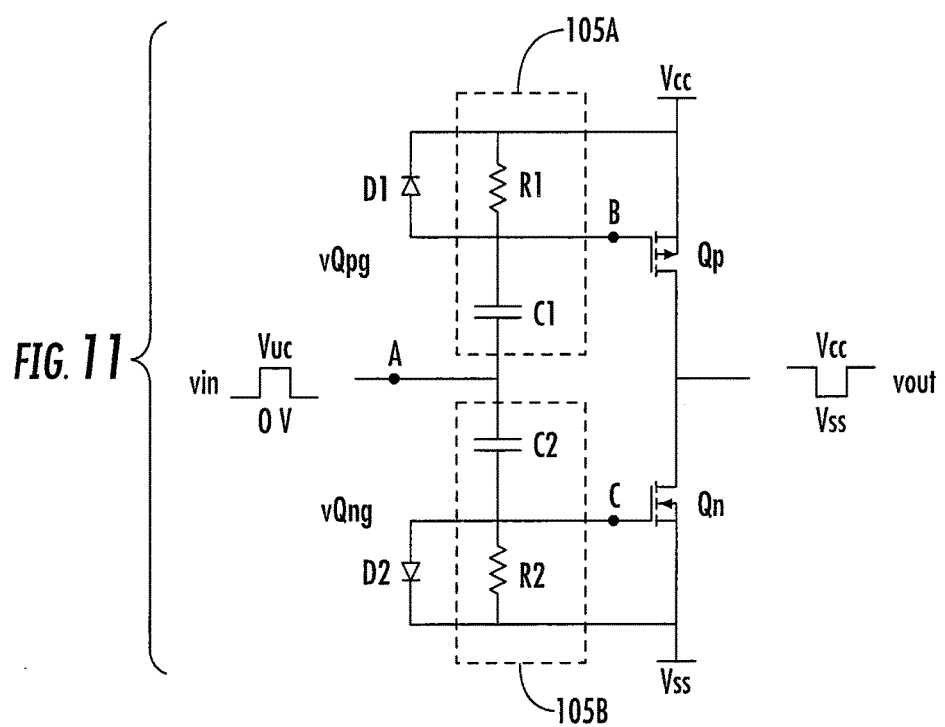
FIG. 11 is an inverting voltage level shifting circuit in some embodiments according to the invention.

FIG. 11 is gate-drive circuit includes a voltage level shifting circuit 105 that include two voltage level shifting circuits 105A and 105B in some embodiments according to the invention. According to FIG. 11, the voltage level shifting circuit 105A can include a capacitor C1 coupled in series with a resistor R1 whereas the second voltage level shifting circuit 105A can include a capacitor C2 coupled in series with a resistor R2. The combination of the capacitor C1, the resistor R1 and the diode D1 can provide a constant voltage element so that a constant voltage level shift $V_{shift1}$ can be provided between an input node A of the first voltage level shifting circuit 10A and an output node B of the first voltage level shifting circuit 105A, which is coupled to the base of a transistor $Q_p$.

Similarly, the combination of the capacitor C2, the resistor R2 and the diode D2 in the second voltage level shifting circuit 105B can provide a constant voltage element so that a constant voltage level shift $V_{shift2}$ can be provided between the input node A of the second voltage level shifting circuit 105B and an output node C of the second voltage level shifting circuit 105B, which is coupled to the base of a transistor $Q_n$. The diode D1 can be configured to prevent the voltage at the base of transistor $Q_p$ from exceeding $V_{cc}$, which also defines $V_{shift}$ to be $V_{cc}$ less $V_{uc}$.

In operation, when the input signal $V_{in}$ varies between a voltage level of 0 volts (for a low logic level) and $V_{uc}$ (corresponding to a high logic level), a first shifted voltage level VQpg provided at the gate of the transistor $Q_p$ (i.e., the output of the first voltage level shifting circuit 105A) varies from a low voltage level of about $V_{cc}-V_{uc}$ and $V_{cc}$ in response to the different states of the PMOS and NMOS transistors Qp and Qn, respectively. Further, a second shifted voltage level VQng provided at the gate of the transistor $Q_n$ (i.e., the output of the second voltage level shifting circuit 105B) varies from a low voltage level of about $V_{ss}$ and $V_{ss}+V_{uc}$. Accordingly, as the input voltage toggles between 0 to $V_{cc}$, the transistor $Q_p$ is toggled on/off and Qn is toggled off/on so that the output signal $V_{out}$ is inverted relative to the input signal $V_{in}$ and is amplified to vary between a voltage level of about $V_{cc}$ and $V_{ss}$ (i.e., amplified into the output voltage domain) responsive to the switching of the input signal $V_{in}$ (in the input voltage domain). Accordingly, when the input signal $V_{in}$ varies between 0 volts and about 3.3 volts, the output signal $V_{out}$ can vary between about +12 volts DC and −12 volts DC when the $V_{cc}$ power supply is equal to about 12 volts DC and $V_{ss}$ power supply is equal to about −12 volts DC.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present inventive subject matter. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that when an element or layer is referred to as being "on" another element or layer, the element or layer can be directly on another element or layer or intervening elements or layers may also be present. In contrast, when an element is referred to as being "directly on" another element or layer, there are no intervening elements or layers present. As used herein, the term "and/or" includes any and all combinations of one or more of the associated listed items.

Spatially relative terms, such as "below", "beneath", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation, in addition to the orientation depicted in the figures. Throughout the specification, like reference numerals in the drawings denote like elements.

Embodiments of the inventive subject matter are described herein with reference to plan and perspective illustrations that are schematic illustrations of idealized embodiments of the inventive subject matter. As such, variations from the shapes of the illustrations as a result, for example, of manufacturing techniques and/or tolerances, are to be expected. Thus, the inventive subject matter should not be construed as limited to the particular shapes of objects illustrated herein, but should include deviations in shapes that result, for example, from manufacturing. Thus, the objects illustrated in the figures are schematic in nature and their shapes are not intended to illustrate the actual shape of a region of a device and are not intended to limit the scope of the inventive subject matter.

The terminology used herein is for the purpose of describing particular embodiments only and is not intended to be limiting of the present inventive subject matter. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this present inventive subject matter belongs. It will be further understood that terms used herein should be interpreted as having a meaning that is consistent with their meaning in the context of this specification and the relevant art and will not be interpreted in an idealized or overly formal sense unless expressly so defined herein. The term "plurality" is used herein to refer to two or more of the referenced item.

It will be understood that, as used herein, the term light emitting diode may include a light emitting diode, laser diode and/or other semiconductor device which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive layers.

In the drawings and specification, there have been disclosed typical preferred embodiments of the inventive subject matter and, although specific terms are employed, they are used in a generic and descriptive sense only and not for purposes of limitation, the scope of the inventive subject matter being set forth in the following claims.

What is claimed:

1. A level shifting circuit comprising:
  a level shifting circuit input node coupled to an input signal, the input signal configured to switch between discrete voltage levels in an input voltage domain;
  a level shifting circuit output node configured to provide shifted voltage levels that are shifted relative to the input signal responsive to switching of the input signal;
  a switching element coupled to the level shifting circuit output node, the switching element including an output that is configured to switch between discrete voltage levels in an output voltage domain responsive to the input signal;
  a switched mode power supply circuit coupled to the output of the switching element, an input of the switched mode power supply circuit configured to control switching of the switched mode power supply circuit responsive to the input signal; and
  a constant voltage element having a first terminal coupled to the level shifting circuit input node and having a second terminal coupled to the level shifting circuit output node, the constant voltage element being configured to provide a constant voltage level shift to the input signal to provide the shifted voltage levels responsive to switching of the input signal between the discrete voltage levels in the input voltage domain, wherein the constant voltage element comprises a capacitor, the level shifting circuit further comprising:
  a resistive element coupled to the level shifting circuit output node,
  wherein a resistive value of the resistive element and a value of the capacitor provide an RC time constant that is greater than a switching frequency of the input signal,
  wherein the switched mode power supply circuit comprises:
    a rectifier circuit coupled to an AC voltage source; and
    a boost converter circuit coupled to the rectifier circuit, and
  wherein the boost converter circuit is configured to be controlled by a pulse width modulated signal of the output of the switching element.

2. The circuit of claim 1 wherein a voltage limit is applied to the level shifting circuit output node to define the shifted voltage levels on the constant voltage element.

3. The circuit of claim 1 wherein the shifted voltage levels comprise discrete voltage levels in an output voltage domain that is different than the input voltage domain.

4. The circuit of claim 3 wherein the discrete voltage levels of the input voltage domain are about 0 volts to about 3.3 volts DC and the discrete voltage levels of the output voltage domain are about 0 volts to about 12 volts DC.

5. The circuit of claim 3 wherein the constant voltage level shift is configured to shift a first voltage level of the input voltage domain to a second voltage level of the output voltage domain that is lower than the first voltage level.

6. The circuit of claim 1 wherein the constant voltage level shift is configured to provide the shifted voltage levels at the level shifting circuit output node to turn the switching element on responsive to a first discrete voltage level in the input voltage domain and configured to turn the switching element off responsive to a second discrete voltage level in the input voltage domain.

7. The circuit of claim 1 wherein the switching element comprises a first switching element, the circuit further comprising:
  a second switching element coupled in series with the first switching element and coupled to the level shifting circuit input node.

8. A level shifting circuit comprising:
  a level shifting circuit input node coupled to an input signal, the input signal configured to switch between discrete voltage levels in an input voltage domain;

a first level shifting circuit output node configured to provide first shifted voltage levels that are shifted relative to the input signal responsive to switching of the input signal;

a first constant voltage element having a first terminal coupled to the level shifting circuit input node and having a second terminal coupled to the first level shifting circuit output node, the first constant voltage element being configured to provide a first constant voltage level shift to the input signal to provide the first shifted voltage levels responsive to switching of the input signal between the discrete voltage levels in the input voltage domain, wherein the first constant voltage element comprises a capacitor;

a resistive element coupled to the first level shifting circuit output node, wherein a resistive value of the resistive element and a value of the capacitor provide an RC time constant that is greater than a switching frequency of the input signal; and a second constant voltage element having a first terminal coupled to the level shifting circuit input node and having a second terminal coupled to a second level shifting circuit output node, the second constant voltage element being configured to provide a second constant voltage level shift, which is opposite to a polarity of the first constant voltage level shift of the first constant voltage element, to the input signal to provide second shifted voltage levels responsive to switching of the input signal between the discrete voltage levels in the input voltage domain wherein the value of the capacitor is at least 5 times greater than a parasitic capacitance of a load coupled to the first level shifting circuit output node, and wherein the level shifting circuit is coupled to a solid state based light fixture.

9. A lighting apparatus comprising:

a controller circuit configured to provide a first voltage domain switched mode power supply control signal;

a level shifting circuit coupled to the first voltage domain switched mode power supply control signal and configured to provide a constant voltage level shift to the first voltage domain switched mode power supply control signal to provide a second voltage domain switched mode power supply control signal, wherein the level shifting circuit includes a capacitor;

a switched mode power supply circuit configured to couple to an AC voltage source, the switched mode power supply circuit configured to provide a DC output voltage responsive to the second voltage domain switched mode power supply control signal using the AC voltage source; and at least one light emitting device (LED) coupled to the DC output voltage, the LED comprising a solid state light emitting down light, the lighting apparatus further comprising:

a resistor coupled to the level shifting circuit, wherein a resistive value of the resistor and a value of the capacitor provide an RC time constant that is greater than a switching frequency of the first voltage domain switched mode power supply control signal; and wherein the value of the capacitor is at least 5 times greater than a parasitic capacitance of a load coupled to an output of the level shifting circuit.

10. The lighting apparatus of claim 9 wherein a voltage limit is applied to the output of the level shifting circuit to define the constant voltage level shift on the capacitor.

11. The lighting apparatus of claim 9 wherein the constant voltage level shift comprises discrete voltage levels in a second voltage domain that is different than a first voltage domain.

12. The lighting apparatus of claim 9 wherein the switched mode power supply circuit comprises:

a rectifier circuit coupled to the AC voltage source; and a boost converter circuit coupled to the rectifier circuit, wherein the boost converter circuit is configured to be controlled by the second voltage domain switched mode power supply control signal.

* * * * *